(12) United States Patent
Klein et al.

(10) Patent No.: US 10,032,682 B1
(45) Date of Patent: Jul. 24, 2018

(54) MULTI-DIE WAFER-LEVEL TEST AND ASSEMBLY WITHOUT COMPREHENSIVE INDIVIDUAL DIE SINGULATION

(71) Applicant: Xilinx, Inc., San Jose, CA (US)

(72) Inventors: Matthew H. Klein, Redwood City, CA (US); Raghunandan Chaware, Sunnyvale, CA (US); Glenn O'Rourke, Gilroy, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/359,280

(22) Filed: Nov. 22, 2016

(51) Int. Cl.
*H01L 21/66* (2006.01)
*H01L 21/78* (2006.01)
*H01L 21/56* (2006.01)
*H01L 23/00* (2006.01)

(52) U.S. Cl.
CPC ............ *H01L 22/14* (2013.01); *H01L 21/561* (2013.01); *H01L 21/78* (2013.01); *H01L 24/14* (2013.01)

(58) Field of Classification Search
None
See application file for complete search history.

(56) References Cited

U.S. PATENT DOCUMENTS

| 7,811,842 | B2 | 10/2010 | Liu et al. | |
|---|---|---|---|---|
| 9,012,245 | B1 * | 4/2015 | Klein | H01L 22/22 |
| | | | | 438/106 |
| 2016/0071829 | A1 * | 3/2016 | Yu | H01L 21/56 |
| | | | | 257/773 |

* cited by examiner

*Primary Examiner* — Bradley K Smith
(74) *Attorney, Agent, or Firm* — Steven Roberts

(57) ABSTRACT

Methods and apparatus are described for creating a multi-die package from a wafer without dicing the wafer into individual dies and reassembling the dies on an interposer. One example method generally includes testing a plurality of IC dies disposed on a wafer; disposing one or more connectivity layers above the plurality of IC dies, the one or more connectivity layers comprising one or more electrical conductors configured to connect together two or more of the plurality of dies in each of one or more groups of the IC dies; dicing the wafer having the one or more connectivity layers disposed above the plurality of dies into sets, each set comprising one or more of the plurality of dies, wherein the dicing is based on the one or more groups having IC dies that passed the testing; and packaging at least a portion of the sets of dies.

19 Claims, 16 Drawing Sheets

MULTI-DIE WAFER-LEVEL TEST AND ASSEMBLY WITHOUT COMPREHENSIVE INDIVIDUAL DIE SINGULATION

TECHNICAL FIELD

Examples of the present disclosure generally relate to integrated circuits and, more particularly, to integrated circuit packaging.

BACKGROUND

Electronic devices (e.g., computers, laptops, tablets, copiers, digital cameras, smart phones, and the like) often employ integrated circuits (ICs, also known as "chips"). These integrated circuits are typically implemented as semiconductor dies packaged in integrated circuit packages. The semiconductor dies may include memory, logic, and/or any of various other suitable circuit types.

Many integrated circuits and other semiconductor devices utilize an arrangement of bumps, such as a ball grid array (BGA), for surface mounting packages to a circuit board (e.g., printed circuit board (PCB). Any of various suitable package pin structures, such as controlled collapse chip connection (C4) bumps or microbumps (as used in stacked silicon interconnect (SSI) applications), may be used to conduct electrical signals between a channel on an integrated circuit (IC) die (or other package device) and the circuit board on which the package is mounted.

SUMMARY

One example of the present disclosure is a method of fabricating a plurality of integrated circuit (IC) packages. The method generally includes testing a plurality of IC dies disposed on a wafer; disposing one or more connectivity layers above the plurality of IC dies, the one or more connectivity layers comprising one or more electrical conductors disposed in an electrically insulative or semiconductive material, wherein the electrical conductors are configured to connect together two or more of the plurality of IC dies in each of one or more groups of the IC dies; dicing the wafer having the one or more connectivity layers disposed above the plurality of IC dies into sets, each set comprising one or more of the plurality of IC dies, wherein the dicing is based at least in part on the one or more groups having IC dies that passed the testing; and packaging at least a portion of the sets of IC dies.

Another example of the present disclosure is an assembly. The assembly generally includes a wafer, a plurality of IC dies disposed on the wafer, and one or more connectivity layers disposed above the plurality of IC dies, the one or more connectivity layers comprising one or more electrical conductors disposed in an electrically insulative or semiconductive material. The electrical conductors are configured to connect together two or more of the plurality of IC dies in each of one or more groups of the IC dies, and the assembly is configured to be diced into sets based at least in part on the one or more groups having IC dies that passed one or more tests, each set comprising one or more of the plurality of IC dies.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Figure 1:
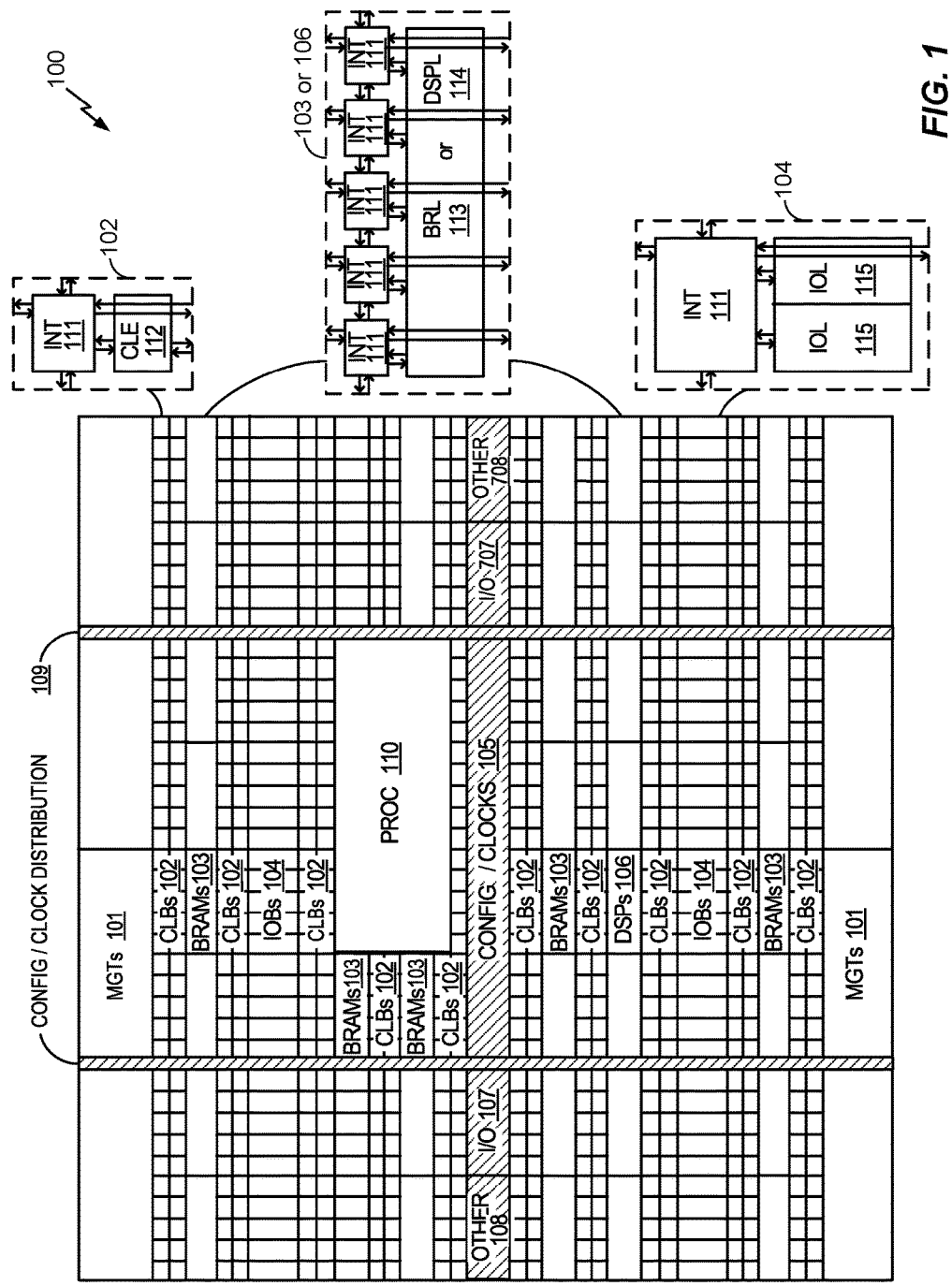
FIG. 1 is a block diagram illustrating an example architecture for a programmable device.

Examples of the present disclosure provide techniques for producing multi-die (and single-die) packages from a single wafer without dicing the wafer into multiple dies and then reassembling the dies onto an interposer. Which dies to group may be dependent on wafer test results and, in some cases, on product demand for single-die versus multi-die products. Wafers may have all dies connected and then selectively diced per test results (and product demand) for some examples, while in other examples, the dies may be selectively connected after the wafer sort test based on the results (and on demand).

In the following description, numerous specific details are set forth to provide a more thorough description of the specific examples described herein. It should be apparent, however, to one skilled in the art, that one or more other examples and/or variations of these examples may be practiced without all the specific details given below. In other instances, well-known features have not been described in detail so as not to obscure the description of the examples herein. For ease of illustration, the same reference numerals are used in different figures to refer to the same items; however, in alternative examples, the items may be different.

Example Integrated Circuit Package

An integrated circuit (IC) die is typically disposed in a package for electrical connection with a circuit board (e.g., a printed circuit board (PCB)). The package protects the integrated circuit die from potential physical damage and moisture, which may lead to corrosion.

Figure 2:
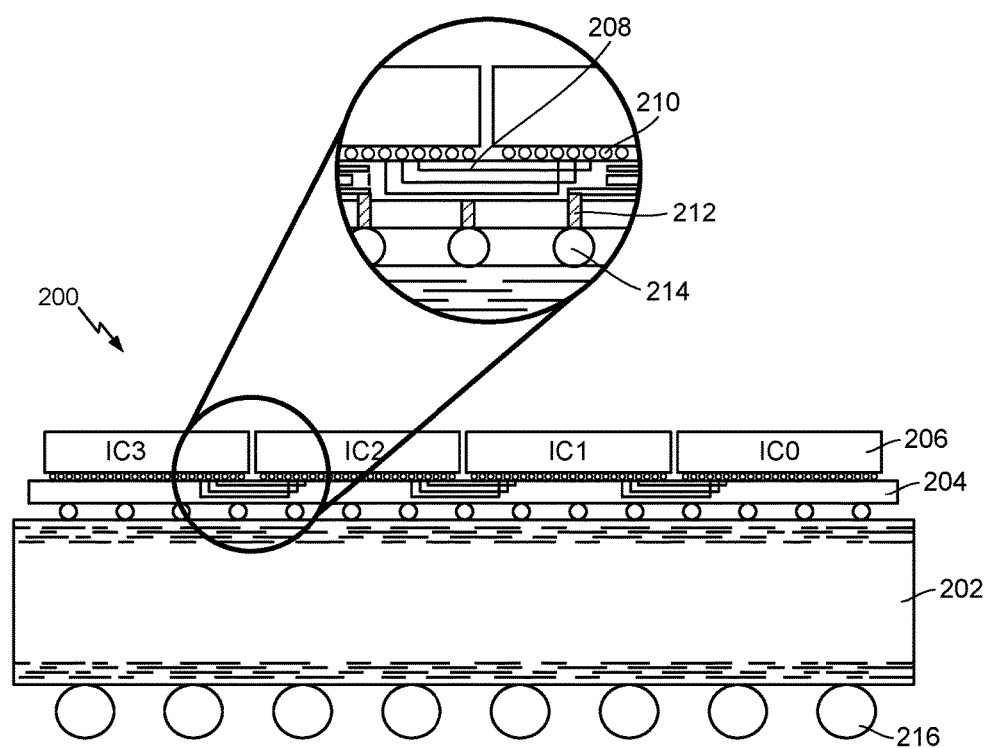
FIG. 2 is a cross-sectional view of an example integrated circuit (IC) package utilizing stacked silicon interconnect (SSI) technology, in accordance with the prior art.

FIG. 2 is a cross-sectional view of an example IC package 200 utilizing stacked silicon interconnect (SSI) technology. The IC package 200 includes a package substrate 202, an interposer 204 disposed above the substrate 202, a plurality of IC dies 206 disposed above the interposer 204, and an encapsulation material (not shown). The encapsulation material may be any of various suitable substances (e.g., resin) for encapsulating and protecting the IC dies 206. The IC dies 206 may include any of various suitable dies, including highly manufacturable field programmable gate array (FPGA) die slices, which may be referred to as super logic regions (SLRs), or other types of programmable ICs (e.g., CPLD dies). Four IC dies 206 (IC0 to IC3) are illustrated in the example IC package 200 of FIG. 2, although the package may include more or less than four IC dies. SSI technology also allows dies of different types or silicon processes to be interconnected on the interposer 204.

The interposer 204 acts as an interconnect vehicle on which the IC dies 206 are set side by side and interconnected. The interposer 204 may be a passive silicon interposer, for example. Although only one interposer 204 is illustrated in FIG. 2, the IC package 200 may be implemented with multiple interposers in place of interposer 204 for some examples. The interposer 204 may include a plurality of interconnect lines 208, which may provide high-bandwidth, low-latency connections through the interposer 204. A plurality of microbumps 210 may be disposed above the interposer 204 for connecting electrically conductive pads of the IC dies 206 to the interconnect lines 208. The interposer 204 may also include a plurality of through-silicon vias (TSVs) 212 for routing connections between the IC dies 206 and a plurality of eutectic bumps 214 (e.g., controlled-collapse chip connection (C4) bumps) disposed between the interposer 204 and the package substrate 202. The TSVs 212 may provide the connections between the IC dies 206 and the substrate 202 for the parallel and serial I/O, power/ground, clocking, configuration signals, and the like. The plurality of eutectic bumps 214 electrically connect the interposer 204 to the substrate 202, and more particularly to conductive elements on the surface of and vias in the substrate.

The IC package 200 also has a plurality of solder balls 216 disposed below the package substrate 202. The solder balls 216 may be arranged, for example, in an array of rows and columns for making electrical contact with a matching arrangement of conductive pads disposed on a surface of a circuit board (e.g., a PCB).

Example Programmable Integrated Circuits

Many different types of integrated circuit (IC) dies 206 may be disposed on the interposer 204 and packaged in the IC package 200. One suitable type of IC is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, dock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

FIG. 1 is a block diagram illustrating an example architecture 100 for a programmable device, which may be implemented in the IC package 200 of FIG. 2. The architecture 100 may be implemented within a field programmable gate array (FPGA), for example. As shown, the architecture 100 includes several different types of programmable circuitry, e.g., logic, blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An 10B 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

Example Multi-Die Wafer-Level Test and Assembly without Die Singulation

As described above, stacked silicon interconnect (SSI) technology devices use an interposer to connect multiple integrated circuit (IC) dies together using fine microbumps and metal traces much denser than what is available in conventional IC package technology or PCB technology. IC packages implemented with SSI technology may be fabricated using Chip-on-Wafer-on-Substrate (CoWoS®) technology available from Taiwan Semiconductor Manufacturing Company (TSMC) of Hsinchu, Taiwan. With CoWoS®, individual dies (of the same or different types) are singulated (e.g., detached by dicing) from one or more wafers and are subsequently positioned on and attached to the interposer 204 (e.g., via bonding). The interposer 204 forms the connections between the IC dies 206. Then, the eutectic bumps 214 of the interposer 204 are bonded to the package substrate 202 to form an IC package. CoWoS® increases manufacturing yield by using singulated dies with smaller area (rather than one large die with increased likelihood of a defect) and then combining these known-good singulated dies in a single assembly to form a larger connected group of dies. While CoWoS® is effective, it would be beneficial to reduce the cost and/or the complexity associated with this process, ideally without reducing the increased yield provided by CoWoS®.

Examples of the present disclosure provide an alternative process to CoWoS® that allows multi-die (and single-die) packages to be created from a single wafer without dicing the wafer into multiple die and then reassembling the die onto an interposer. This process is less complex and may be cheaper than CoWoS®.

Figure 3:
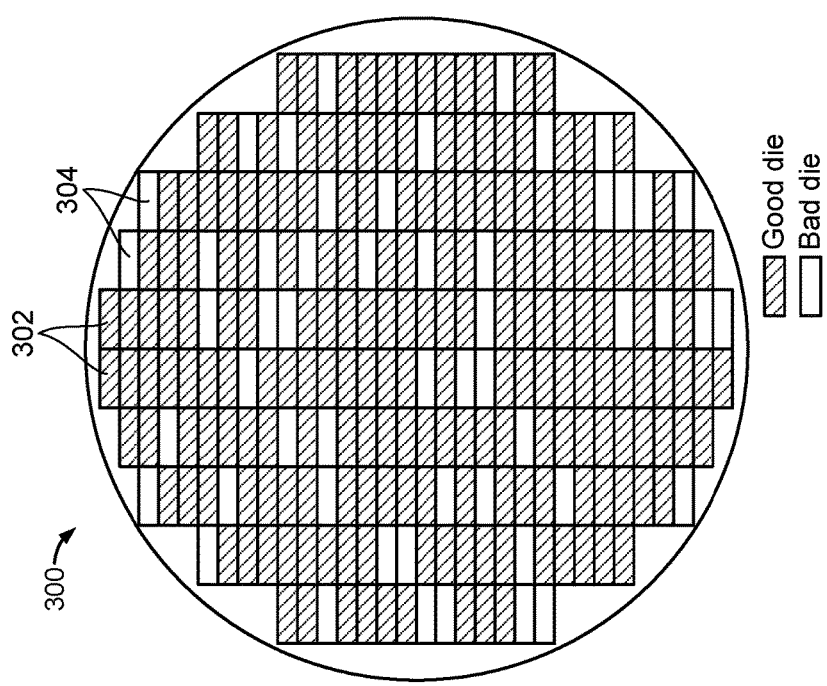
FIG. 3 is a top view of an example wafer illustrating both satisfactory and defective IC dies, in accordance with examples of the present disclosure.

This alternative process involves generating a wafer having multiple IC dies and then tests the individual IC dies to determine which IC dies pass the tests and can be considered as "good" IC dies, and which IC dies have some defect causing the dies to fail one or more of the tests and should be considered as "bad" IC dies. FIG. 3 is a top view of an example wafer 300 illustrating both good IC dies 302 and bad IC dies 304, based on the results of testing, in accordance with examples of the present disclosure. The wafer 300 may contain all the same type of IC dies, or the wafer 300 may contain different types of IC dies. In the latter case, each die type may be confined to a different row of the wafer, for instance. For some examples, the rows of different die types may follow a pattern. For example, a first die type may be arranged in even rows of the wafer 300, whereas a second die type may be arranged in odd rows of the wafer 300. For simplicity, none of the wafer illustrations in the accompanying drawings indicate different die types, but it is to be understood that any of the wafers described herein may include different die types.

Figure 4:
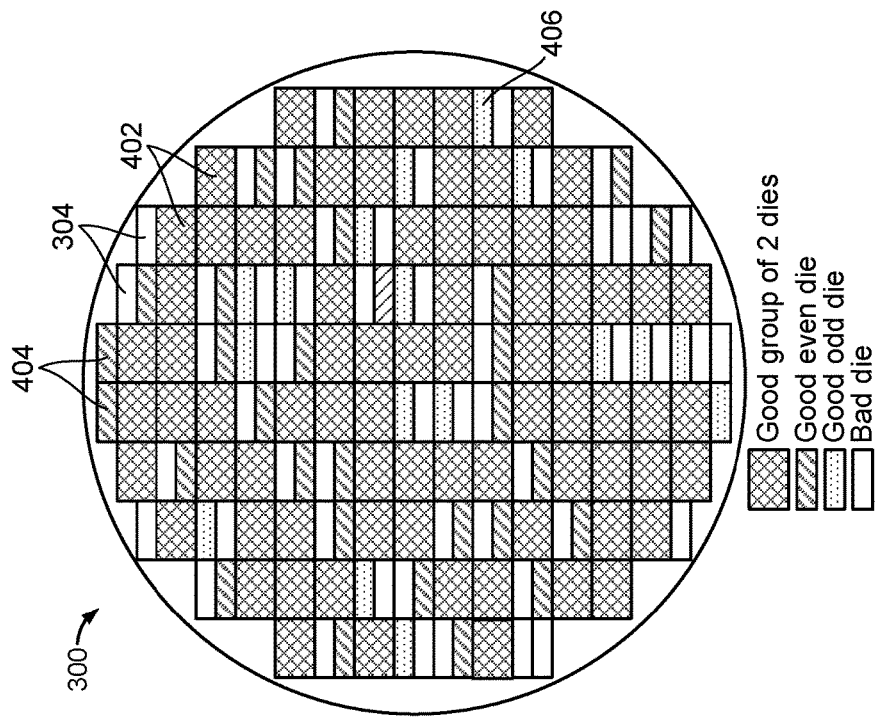
FIG. 4 illustrates grouping the satisfactory IC dies from FIG. 3 into groups of two adjacent dies, in accordance with an example of the present disclosure.

The example process also entails identifying positions on the wafer where multiple dies can be grouped together. FIG. 4 illustrates this identification for the wafer 300 of FIG. 3, where two adjacent good IC dies 302 can be grouped to form a good group of two dies 402, in accordance with an example of the present disclosure. FIG. 4 also illustrates groups of two adjacent IC dies in which one of the IC dies is defective. For some examples, such as in the case of alternating rows of two different types of IC dies, the example process may differentiate between groups of ICs based on which IC die is good. For example, the example process may distinguish between: (1) groups of two adjacent dies where the first die type is good and (2) groups of two adjacent dies where the second die type is good. In the example of FIG. 4, the example process has identified groups of two adjacent IC dies where the die in an even row of the wafer 300 is a good IC die (referred to as a "good even IC die" 404) and groups of two adjacent IC dies where the die in an odd row of the wafer 300 is a good IC die (referred to as a "good odd IC die" 406). Since all of the good IC dies 302 in the wafer 300 can be grouped and used as illustrated in FIG. 4, the yield of the grouped wafer in FIG. 4 remains the same as the yield of the wafer 300 in FIG. 3.

Figure 5:
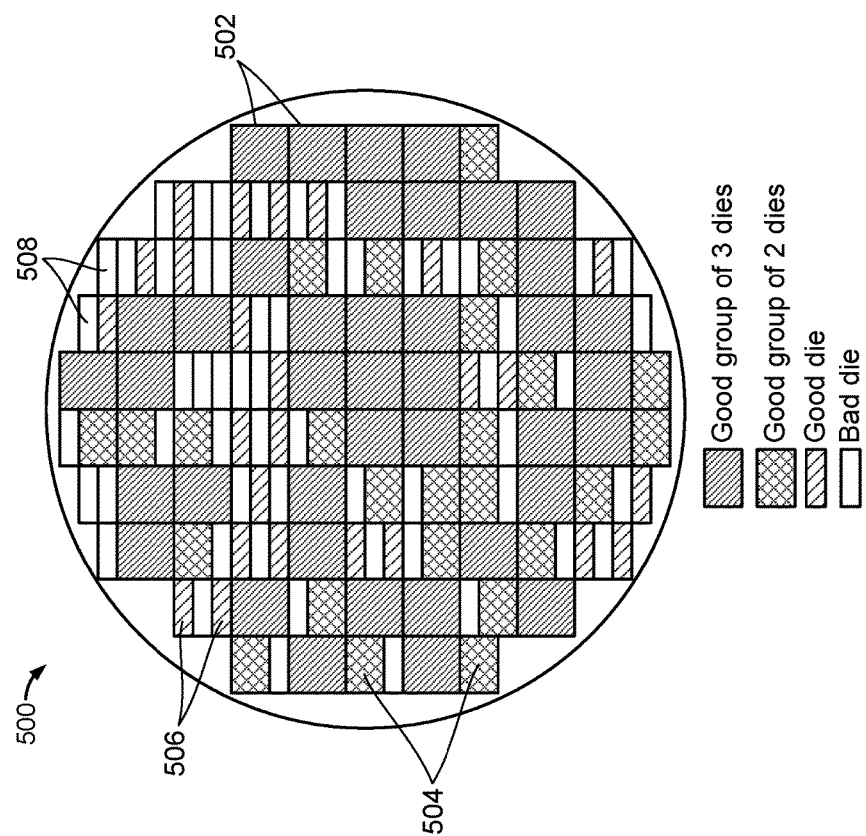
FIG. 5 illustrates grouping satisfactory IC dies into groups of two and three adjacent dies, in accordance with an example of the present disclosure.

The identification of positions on the wafer where multiple dies can be grouped together need not be restricted to only groups of two adjacent IC dies or to only one type of group with the same number of IC dies. For example, the wafer 500 in FIG. 5 illustrates this identification of multiple group types, where three adjacent good IC dies can be grouped to form a good group of three dies 502 and where two adjacent good IC dies can be grouped to form a good group of two dies 504, in accordance with an example of the present disclosure. FIG. 5 also illustrates good IC dies that could not be grouped with one or more adjacent good IC dies remaining as single good IC dies 506, as well as the bad IC dies 508 that prevented further grouping.

Although the identification of positions on the wafer where multiple dies can be grouped is illustrated in FIGS. 4 and 5 as occurring according to predefined rows on the wafer, this need not be the case. For some examples, the identification of positions on the wafers for grouping multiple dies may be based solely on the testing of each individual die, independent from any predefined rows. In this case, groups of one, two, three, four, or more adjacent good IC dies (e.g., in a column of the wafer) may be formed.

For some examples, a mask layer may be applied to the wafer to connect the IC dies in each group in one or more upper layers of the mask during wafer possessing. Die groups which include only good IC dies (i.e., do not include a bad IC die) may be packaged and designated appropriately as a fully functional die product. Die groups which include at least one bad IC die may be packaged and designated according to which IC die is bad (or to which IC die(s) is/are good). In this manner, the yielding wafer area is preserved since all passing IC dies are utilized in packaged products.

For other examples, connectivity may be added after wafer processing to the IC dies in each group. For instance, the connectivity may be added using one or more redistribution layers (RDLs), an interposer, or another type of high density fan-out (HDFO) structure. For some examples, connectivity may be added before wafer sort and then the connectivity between groups may be removed during wafer dicing, while in other examples, connectivity may be added after the identification of which dies in the groups are good. The decision with respect to which IC dies will be connected by the connectivity features may also be made based on product demand at a particular time.

Figure 6:
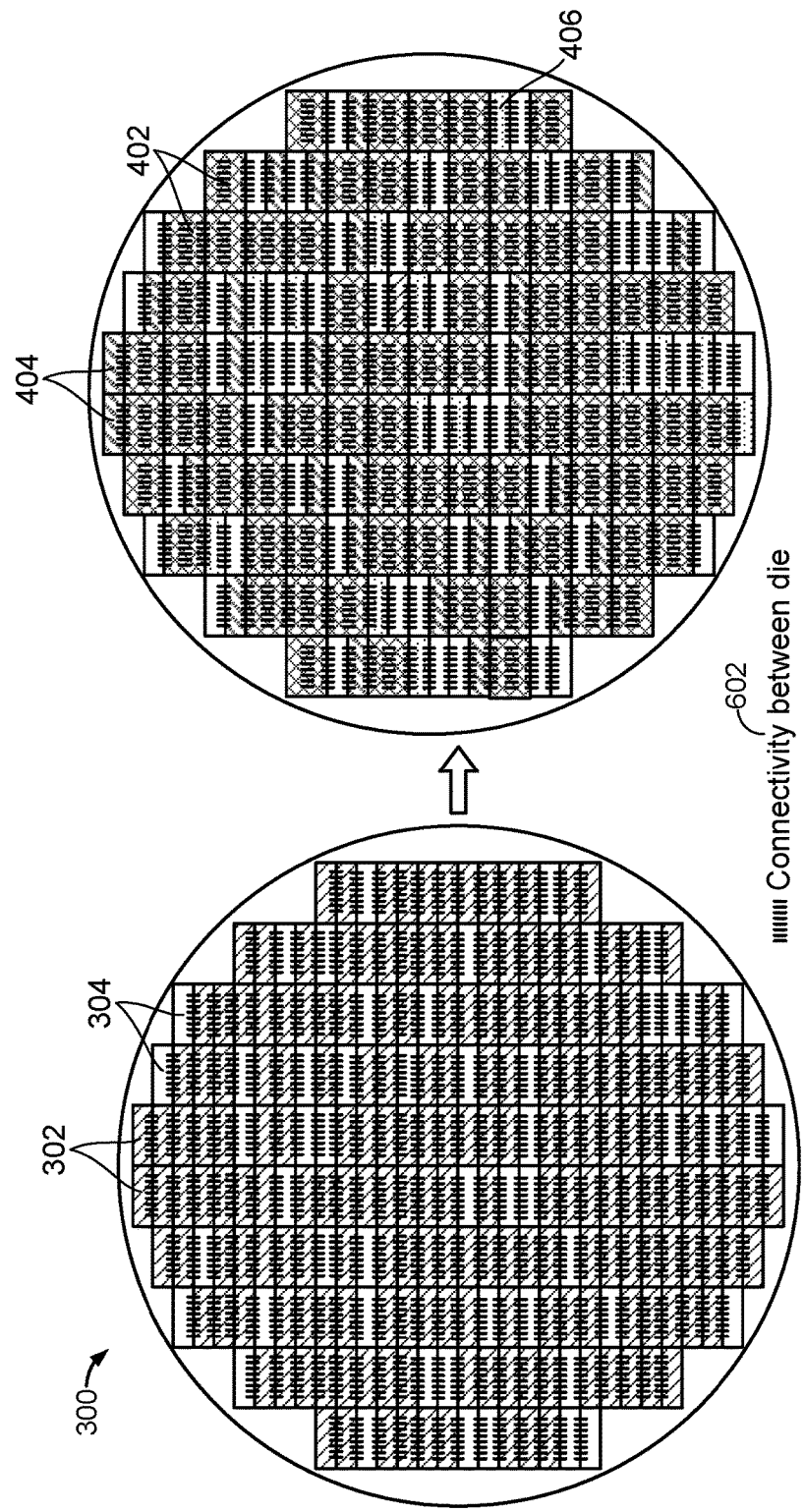
FIG. 6 illustrates adding connections between the IC dies in the wafer of FIG. 3 independent of the testing to determine which dies are satisfactory or defective, in accordance with an example of the present disclosure.

FIG. 6 illustrates adding connections 602 between the IC dies in the wafer 300 of FIG. 3 independent of the testing to determine good and bad IC dies, in accordance with an example of the present disclosure. The connections 602 may be added at the wafer level by any of various suitable techniques, examples of which are described below in greater detail and illustrated in FIGS. 8A-11G. Since the connections 602 are added independent of the testing, the connections may be added to the wafer with the IC dies before or after the testing of the individual IC dies. In the example of FIG. 6, each and every one of the IC dies is connected by the connections 602 to at least another one of the IC dies, regardless whether the adjacent IC dies are good or bad. After identification of the groups (e.g., the good group of two dies 402, the good even IC dies 404, and the good odd IC dies 406), the wafer may be diced into different sets of IC dies. This dicing may be based, at least in part, on the various groups and, in some cases, on product demand. The dicing of the wafer will cut through the connections 602 between the different sets of IC dies. For some examples, the dicing may include stealth dicing, which may involve use of a pulsed laser, for example. In stealth dicing, the wafer may be diced into the different sets of IC dies according to any desired pattern (e.g., based on the test results and/or product demand) on a per-wafer basis.

Figure 7:
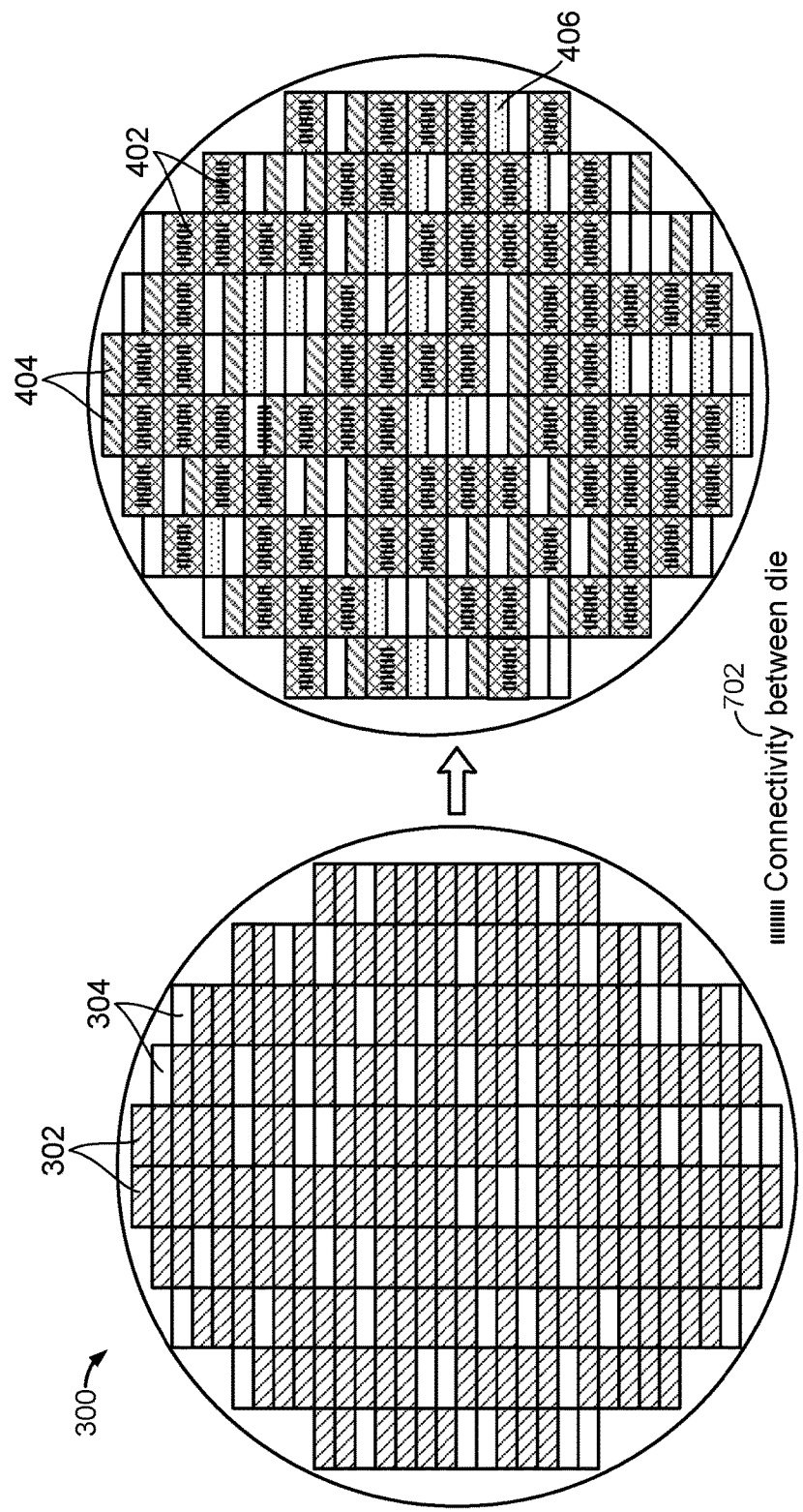
FIG. 7 illustrates adding connections between the IC dies in the wafer of FIG. 3 according to the testing, such that only groups of satisfactory IC dies are connected, in accordance with an example of the present disclosure.

FIG. 7 illustrates adding connections 702 between the IC dies in the wafer 300 of FIG. 3 according to the testing, in accordance with an example of the present disclosure. The connections 702 are added based on where multiple passing dies can be connected. In this manner, only groups of two or more good IC dies (e.g., the good groups of two dies 402) have the connections 702. The groups with at least one bad IC die (e.g., the good even IC dies 404 and the good odd IC dies 406) do not have the connections 702 between the bad IC die 304 and the good IC die 302.

Figure 8A:
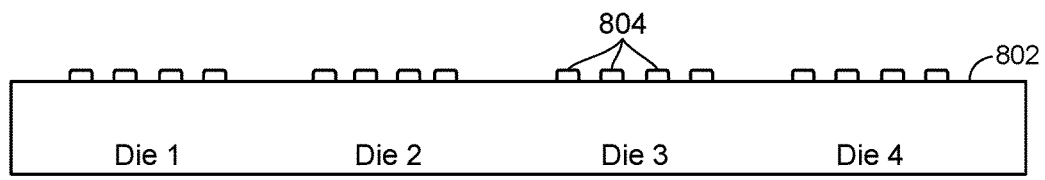
FIGS. 8A-8G illustrate a process flow for fabricating IC packages by disposing a redistribution layer (RDL) above IC dies on a non-singulated wafer, in accordance with an example of the present disclosure.
Figure 8B:
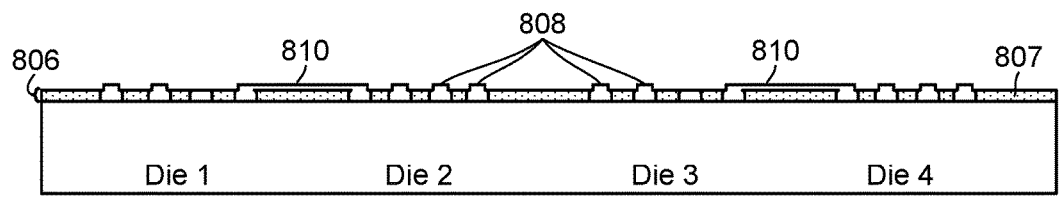
Figure 8C:
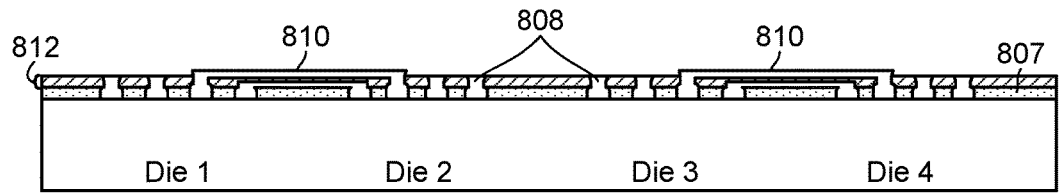
Figure 8D:
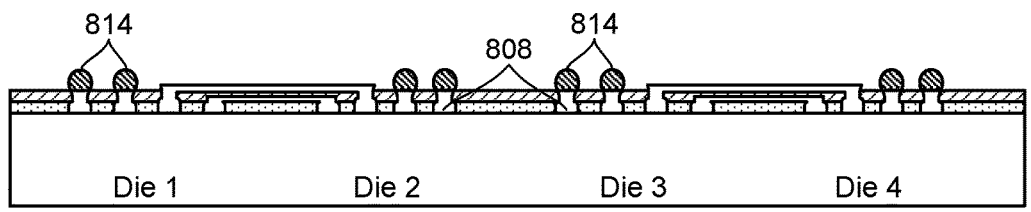
Figure 8E:
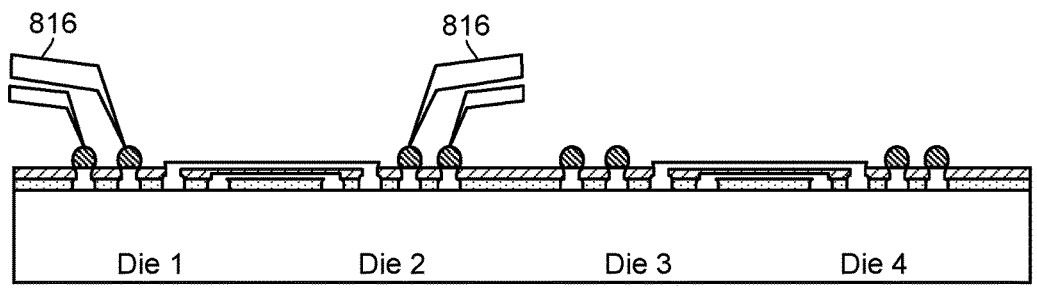
Figure 8F:
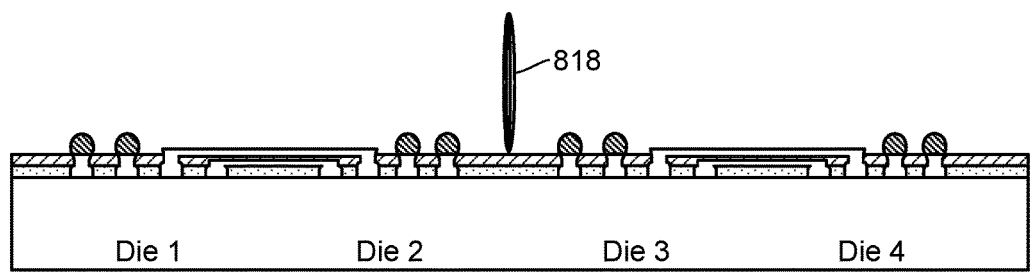
Figure 8G:
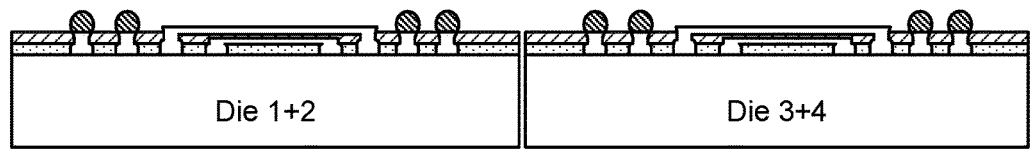

FIGS. 8A-8G illustrate a process flow for fabricating IC packages by disposing one or more connectivity layers above the IC dies on a non-singulated wafer, in accordance with an example of the present disclosure. FIG. 8A illustrates a wafer 802 with multiple IC dies (labeled "Die 1" through "Die 4") disposed thereon. Although four IC dies are shown in FIGS. 8A-8G, the process flow illustrated therein may operate on more or less than four IC dies. Each of the IC dies may have microbumps 804 (e.g., analogous to the microbumps 210 in FIG. 2) disposed on an upper surface of the dies. FIG. 8B illustrates the addition of a first connectivity layer 806 above the IC dies and microbumps 804. The first connectivity layer 806 may include electrical conductors disposed in an electrically insulative or semi-conductive material 807 (e.g., silicon). The electrical conductors may include at least portions of vias 808 connected with the microbumps 804 and traces 810 connected between the vias 808 of two different IC dies. The electrical conductors may form the connections 602 or 702 in FIG. 6 or 7, respectively. FIG. 8C illustrates the addition of a second connectivity layer 812 above the first connectivity layer 806. The second connectivity layer 812 may also include the electrical conductors as described above. Although two connectivity layers 806, 812 are illustrated in FIG. 8C, it is to be illustrated that any suitable number of connectivity layers (more or less than two) may be used. The number of connectivity layers may depend on the number of connections 602 or 702 to be made between the different IC dies. For some examples, the connectivity layers may be redistribution layers (RDLs), analogous to an RDL in the interposer 204. In the interposer 204, the RDL provides a connection pattern of bond pads on the active surface of an IC die to a redistributed connection pattern that is more suitable for connection to the system board. FIG. 8D illustrates the addition of eutectic bumps 814 (analogous to the eutectic bumps 214 in FIG. 2) connected with the vias 808. FIG. 8E illustrates performing wafer sort, using probes 816 to test the IC dies and determine whether each of the IC dies is satisfactory or defective. This information may then be used to identify different groups of IC dies. FIG. 8F illustrates dicing the wafer into sets of IC dies using a dicing tool 818 (e.g., a saw or a laser, which may be used for stealth dicing). As described above, this dicing into sets of IC dies may be based, at least in part, on the various groups and, in some cases, on product demand. In this process flow, FIG. 8G illustrates the four IC dies being diced into two separate two-die products, one composed of dies 1 and 2 and the other composed of dies 3 and 4. These products can then be separately packaged.

Figure 9A:
FIGS. 9A-9F illustrate a process flow for fabricating IC packages by disposing connector dies above IC dies on a non-singulated wafer, in accordance with an example of the present disclosure.
Figure 9B:
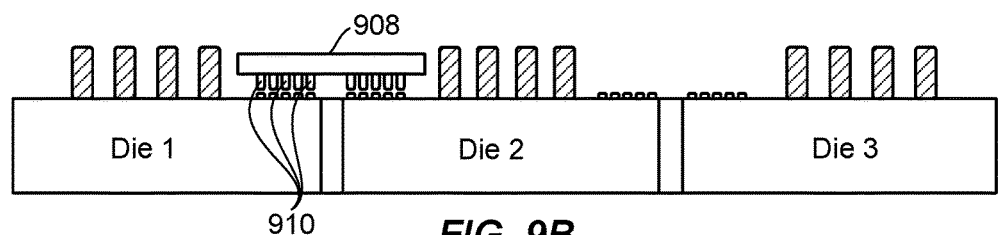
Figure 9C:
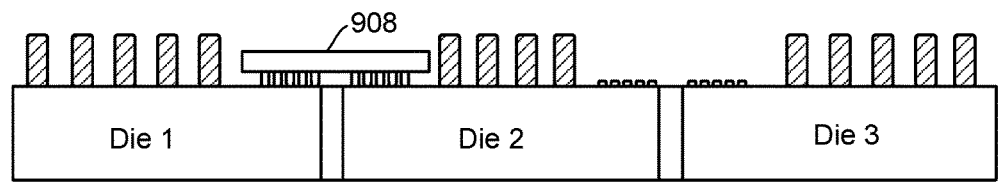
Figure 9D:
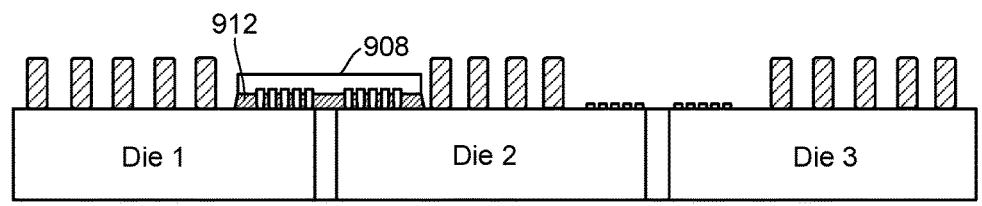
Figure 9E:
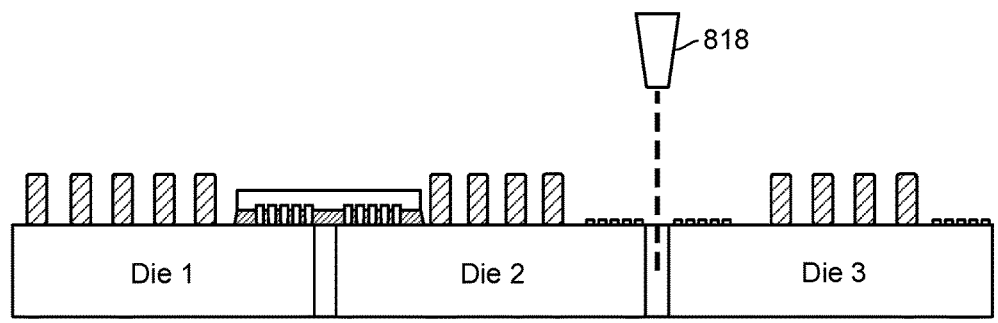
Figure 9F:
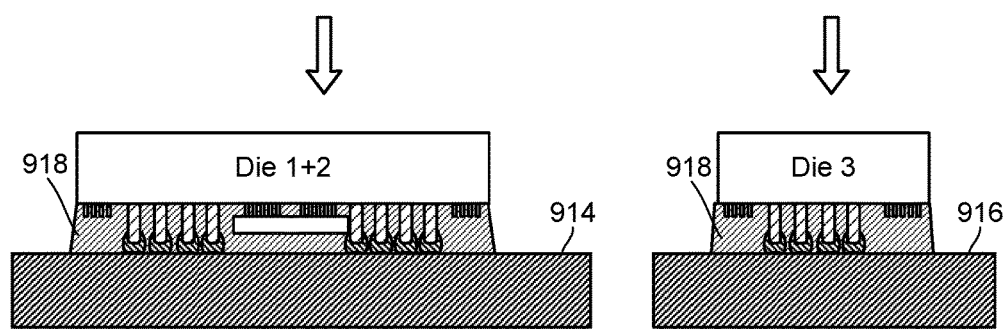

FIGS. 9A-9F illustrate a process flow for fabricating IC packages by disposing connector dies above IC dies on a non-singulated wafer, in accordance with an example of the present disclosure. FIG. 9A illustrates a wafer 902 with multiple IC dies (labeled "Die 1" through "Die 3") disposed thereon. Although three IC dies are shown in FIGS. 9A-9F, the process flow depicted therein may operate on more or less than three IC dies. Each of the IC dies may have micropads 904 and conductive pillars 906 (e.g., composed of copper or any suitable electrically conductive material) disposed on an upper surface of the dies. The conductive pillars 906 may be composed of copper or any other suitable electrically conductive material. FIG. 9B illustrates the generation of a thin connector die 908 separate from the wafer 902. The connector die 908 may include one or more connectivity layers comprising electrical conductors disposed in or on an electrically semiconductive material (e.g., a substrate), which may function similarly and/or comprise the same materials as those described above for the connectivity layers 806, 812. The connector die 908 may have microbumps 910 disposed on a surface thereof. After the connector die 908 has been fabricated separately from the wafer 902, FIG. 9C illustrates the connector die 908 being bonded to the wafer 902, where the microbumps 910 on the surface of the connector die 908 are bonded with the micropads 904 of the wafer 902. FIG. 9D illustrates encapsulating the area between the connector die 908 and the wafer 902, including the bond between the microbumps 910 and the micropads 904, with a first encapsulation material 912. FIG. 9E illustrates dicing the wafer 902 into sets of IC dies using a dicing tool 818. In this example process flow, the three IC dies are diced into two separate products, one composed of dies 1 and 2 and the other composed of die 3 by itself. These products can then be separately packaged. FIG. 9F illustrates bonding the sets of IC dies to package substrates 914, 916 (analogous to the package substrate 202 in FIG. 2) and encapsulating the area between each set of IC dies and the corresponding package substrate with a second encapsulation material 918 (e.g., resin).

Figure 10A:
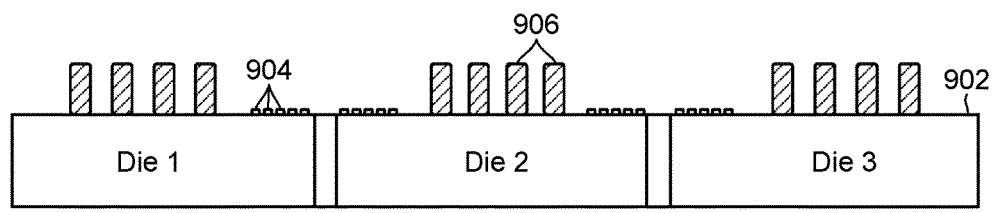
FIGS. 10A-10H illustrate a process flow for fabricating IC packages by disposing connector dies above IC dies on a non-singulated wafer and encapsulating the connector dies, in accordance with an example of the present disclosure.
Figure 10B:
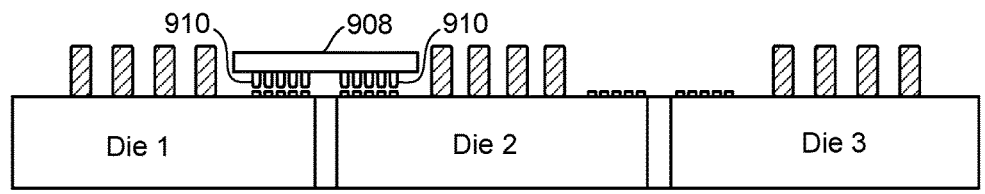
Figure 10C:
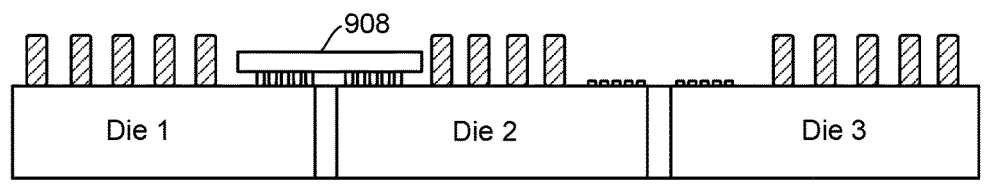
Figures 10D, 10E, 10F, 10G, 10H:
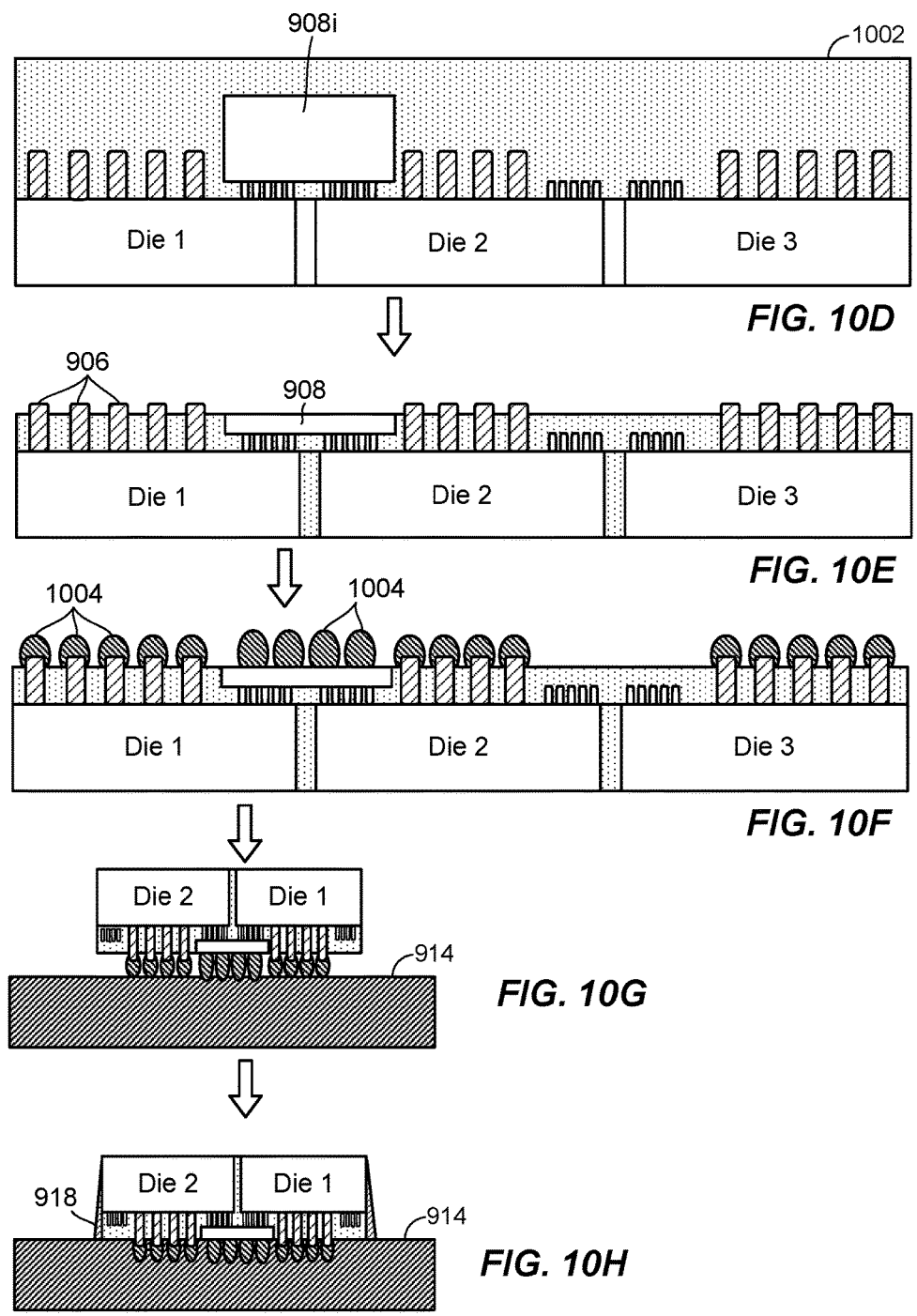

FIGS. 10A-10H illustrate a process flow for fabricating IC packages by disposing connector dies above IC dies on a non-singulated wafer and encapsulating the connector dies, in accordance with an example of the present disclosure. The portion of the process flow depicted in FIGS. 10A-10C is the same as the process flow described above and illustrated in FIGS. 9A-9C. FIG. 10D illustrates adding a wafer mold layer 1002 above the wafer with the connector die 908 bonded thereto. The wafer mold layer 1002 increase structural rigidity during subsequent steps of the process flow. The wafer mold layer 1002 may comprise any suitable substance, such as an encapsulation material (e.g., resin). FIG. 10E illustrates removing at least a portion of the wafer mold layer 1002 in an effort to expose the conductive pillars 906. Removing at least a portion of the wafer mold layer 1002 may be accomplished using any of various suitable techniques, such as grinding, polishing, etching, or a combination thereof. For some examples, the thickness of the initial connector die 908*i* may be greater, such that the removal of the at least a portion of the wafer mold layer 1002 also decreases the thickness of the connector die 908 down to a desired thickness for the IC package. FIG. 10F illustrates adding eutectic bumps 1004 (analogous to the eutectic bumps 214 in FIG. 2) to the exposed surfaces of the conductive pillars 906. For some examples, the eutectic bumps 1004 may also be added to the exposed surface of the connector die 908. After dicing the wafer 902 into sets of IC dies, FIG. 10G illustrates bonding the set comprising dies 1 and 2 to the package substrate 914. FIG. 10H illustrates encapsulating the area between the set of IC dies and the package substrate 914 with the second encapsulation material 918.

Figure 11A:
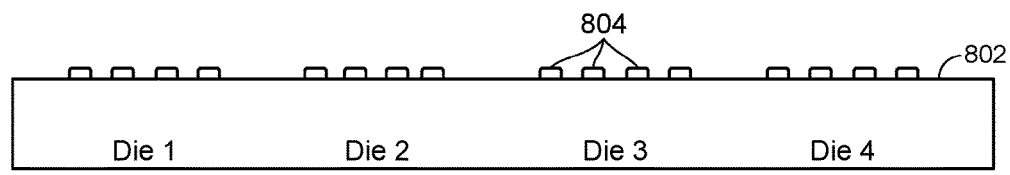
FIGS. 11A-11G illustrate a process flow for fabricating IC packages by bonding a wafer having connectivity layers above IC dies on a non-singulated wafer, in accordance with an example of the present disclosure.
Figure 11B:
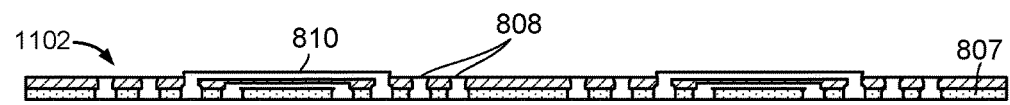
Figure 11C:
Figure 11D:
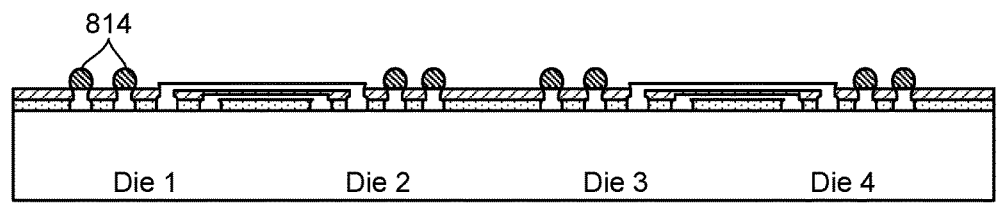
Figure 11E:
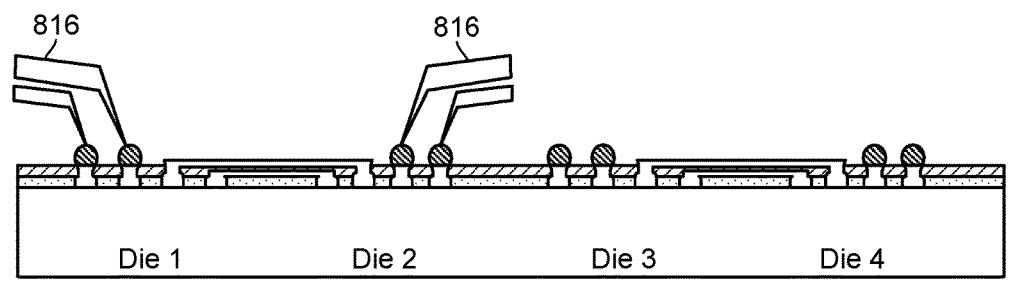
Figure 11F:
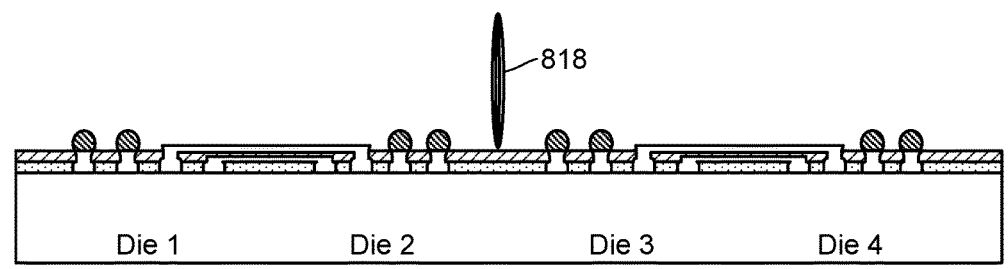
Figure 11G:
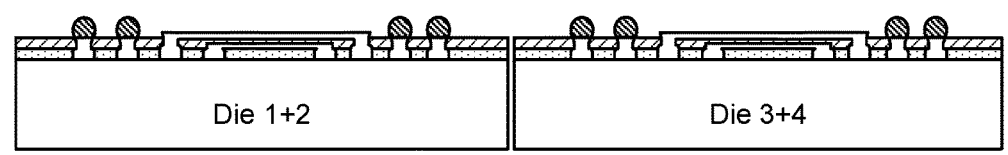

FIGS. 11A-11G illustrate a process flow for fabricating IC packages by bonding a wafer having one or more connectivity layers above IC dies on a non-singulated wafer, in accordance with an example of the present disclosure. This process may be referred to as "wafer-on-wafer bonding." FIG. 11A illustrates the same wafer 802 with microbumps 804 as described above and portrayed in FIG. 8A. However, instead of successively constructing connectivity layers above the IC dies, each new layer built above the previous layer as in FIGS. 8B and 8C, FIG. 11B illustrates fabricating a connectivity wafer 1102 away from the wafer 802. The connectivity wafer 1102 may include electrical conductors disposed in an electrically insulative or semiconductive material 807, where the electrical conductors include vias 808 and traces 810 connected between the vias 808, as described above. After the connectivity wafer 1102 has been generated separately from the wafer 802, FIG. 11C illustrates the connectivity wafer 1102 being bonded to the wafer 802. The remainder of the process flow depicted in FIGS. 11D-11G is the same as the process flow described above and illustrated in FIGS. 8D-8G. Contrasted with SSI technology using CoWoS® in which the wafer is diced and then the singulated dies 206 are disposed on an interposer 204, the process flow in FIGS. 11A-11G involves disposing the connectivity wafer 1102 (which can be considered as performing a similar function as the interposer 204) on the IC dies in the non-singulated wafer.

For some examples, a package substrate (e.g., package substrate 914) may replace the connectivity wafer 1102 in FIGS. 11B-11G. This connectivity package substrate may include electrical conductors disposed in an electrically insulative or semiconductive material (e.g., material 807), and the electrical conductors may include vias (e.g., vias 808) and traces (e.g., traces 810) connected between the vias, as described above. The description of FIGS. 11B-11G for this case may remain the same as above, with the understanding that the connectivity package substrate would be used in place of the connectivity wafer 1102. For some examples, the eutectic bumps 814 in FIGS. 11D-11G may be replaced with solder balls (e.g., solder balls 216 as in FIG. 2).

Figure 12:
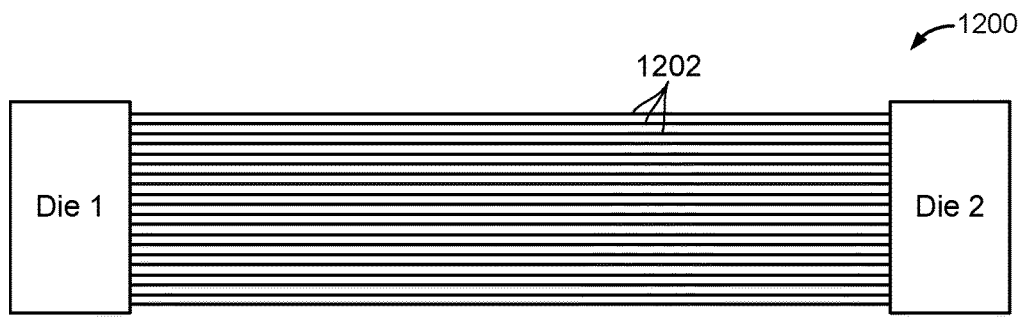
FIGS. 12-14 illustrate different connection structures for the electrical conductors between IC dies on a non-singulated wafer.

FIG. 12 illustrates a top view of an example connection structure 1200 for the electrical conductors 1202 (e.g., the connections 602 or 702 in FIG. 6 or 7, respectively) between two IC dies (labeled "Die 1" and "Die 2"). These electrical conductors 1202 may be created before or after testing the dies as described above, using any suitable method described herein or otherwise. In this connection structure 1200 with the electrical conductors 1202 running continuously between the two IC dies, dicing the wafer with a dicing tool 818 to cut through or otherwise sever the electrical conductors 1202 may leave rough edges, which may be undesirable.

Figure 13:
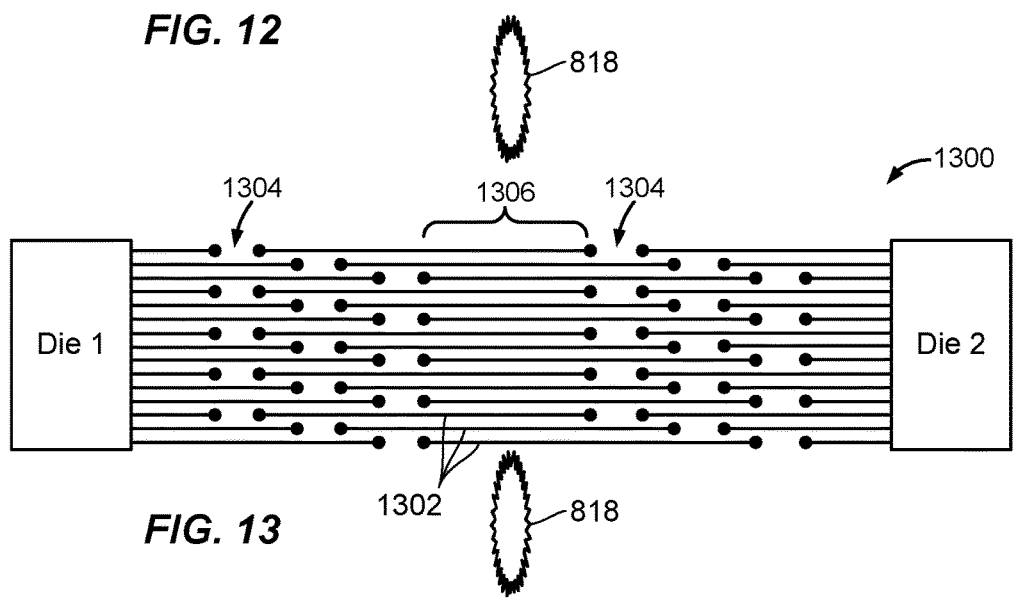
Figure 14:
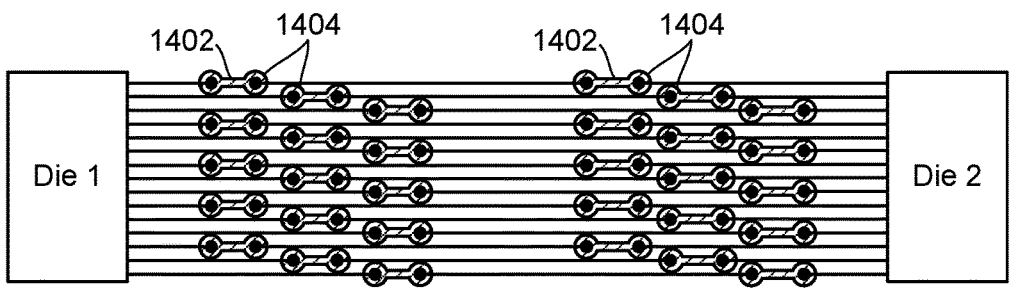

To solve the problem of rough edges, FIG. 13 illustrates a top view of another example connection structure 1300 for the electrical conductors 1202 between the two IC dies, in accordance with an example of the present disclosure. In this connection structure 1300, each of the electrical conductors 1202 has at least one break 1304 (e.g., open circuit) between the two IC dies. FIG. 13 illustrates having two breaks 1304 in each electrical conductor 1202 between the two IC dies. The breaks 1304 may be staggered as depicted in FIG. 13. For some examples, the two breaks 1304 in each electrical conductor 1202 may be separated as shown in FIG. 13, leaving a middle portion 1306 that has parallel continuous electrical conductor segments 1302. If it is desired to singulate the dies, the dicing tool 818 may be applied to the middle portion 1306 between the two IC dies to cut the electrical conductor segments 1302. In this manner, the fabbed physical isolation may prevent the rough edges that occur with the connection structure 1200 in FIG. 12. If it is desired to leave the dies connected, one or more connectivity layers (e.g., an RDL layer or a connector die) may be added to the wafer, with jumpers 1402 connected to vias 1404 to electrically short the breaks 1304, as illustrated in FIG. 14. With the one or more connectivity layers comprising the jumpers 1402 and vias 1404, the two IC dies may be electrically connected.

As described above, examples of the present disclosure allow multi-die (and single-die) packages to be created from a single wafer without dicing the wafer into multiple die and then reassembling the die onto an interposer. Which dies to group may be dependent on wafer test results and, in some cases, on product demand for single-die versus multi-die products. Wafers may have all dies connected and then selectively diced per test results (and demand) for some examples, while in other examples, the dies may be selectively connected after the wafer sort test based on the results (and demand). Examples of the present disclosure may keep the total yielding wafer area for both single-die and multi-die products equal to the yielding area for just single-die products on the same wafer. Additionally, examples of the present disclosure involve far fewer steps, allow customization, and cost less than traditional SSI technology using CoWoS®.

Example Operations for Fabricating IC Packages

Figure 15:
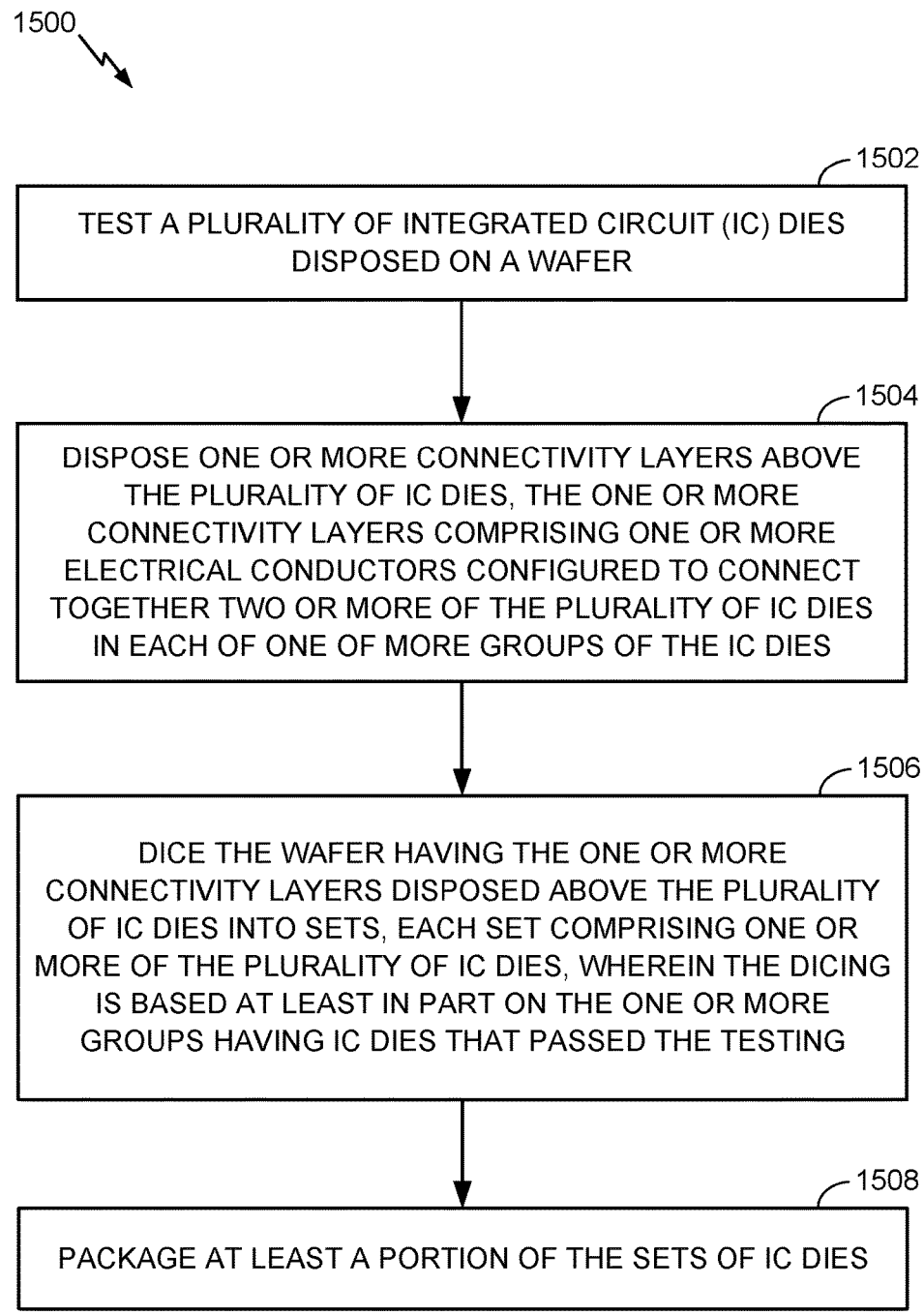
FIG. 15 is a flow diagram of example operations for fabricating a plurality of IC packages, in accordance with an example of the present disclosure.

FIG. 15 is a flow diagram of example operations 1500 for fabricating a plurality of IC packages, in accordance with an example of the present disclosure. The operations 1500 may be performed, for example, by a system for fabricating the IC packages, which may include a semiconductor processing chamber.

The operations 1500 may begin, at block 1502, with the system testing a plurality of IC dies disposed on a wafer. The testing may determine which IC dies pass or fail a test suite.

At block 1504, the system disposes one or more connectivity layers above the plurality of IC dies. The one or more connectivity layers comprise one or more electrical conductors, which may be disposed in an electrically insulative or semiconductive material. The electrical conductors are configured to connect together two or more of the plurality of IC dies in each of one or more groups of the IC dies. The groups of IC dies may be determined based on a fixed pattern for the wafer or on the testing at block 1502.

At block 1506, the system dices the wafer having the one or more connectivity layers disposed above the plurality of IC dies into sets, where each set comprises one or more of the plurality of IC dies. The dicing at block 1506 is based at least in part on the one or more groups having IC dies that passed the testing. For some examples, the dicing at block 1506 may include stealth dicing.

At block 1508, the system packages at least a portion of the sets of IC dies. For some examples, this packaging may be based on the testing at block 1502.

According to some examples, the disposing at block 1504 involves disposing the one or more connectivity layers such that the one or more electrical conductors connect together the plurality of IC dies according to a predetermined pattern.

According to some examples, the disposing at block 1504 entails disposing the one or more connectivity layers such that the one or more electrical conductors connect each of the plurality of IC dies to at least another one of the plurality of IC dies. According to some examples, disposing the one or more connectivity layers above the plurality of IC dies at block 1504 is not based on the testing at block 1502. In this case, the disposing at block 1504 may occur either before or after the testing at block 1502.

According to some examples, dicing the wafer at block 1506 involves cutting through the electrical conductors between IC dies in different sets.

According to some examples, disposing the one or more connectivity layers above the plurality of IC dies at block 1504 is based on the testing at block 1502. In this case, the disposing at block 1504 occurs after the testing at block 1502. For some examples, the disposing at block 1504 includes connecting with the one or more electrical conductors only the two or more of the plurality of IC dies in each of the one or more groups having IC dies that passed the testing at block 1502.

According to some examples, the disposing at block 1504 entails: (1) fabricating another wafer having the one or more connectivity layers comprising the one or more electrical conductors disposed in the electrically insulative or semiconductive material; and (2) bonding the other wafer to the plurality of IC dies disposed on the wafer such that the one or more electrical conductors connect together the two or more of the plurality of IC dies in each of the one or more groups of the IC dies.

According to some examples, the disposing at block 1504 entails: (1) fabricating a package substrate having the one or more connectivity layers comprising the one or more electrical conductors disposed in the electrically insulative or semiconductive material; and (2) bonding the package substrate to the plurality of IC dies disposed on the wafer such that the one or more electrical conductors connect together the two or more of the plurality of IC dies in each of the one or more groups of the IC dies.

According to some examples, each of the plurality of IC dies includes a plurality of microbumps. In this case, the disposing at block 1504 may involve: (1) fabricating one or more connector dies having the one or more connectivity layers comprising the one or more electrical conductors disposed in the electrically insulative or semiconductive material; and (2) bonding each of the connector dies to the plurality of microbumps of two adjacent IC dies in one of the groups of the IC dies. For some examples, each of the plurality of IC dies further includes a plurality of electrically conductive pillars. In this case, the operations 1500 may further entail encapsulating the one or more connector dies and upper surfaces of the plurality of IC dies including the plurality of electrically conductive pillars with an encapsulation material. At least a portion of the encapsulation material may be removed to expose at least a portion of the plurality of electrically conductive pillars. A plurality of eutectic bumps may be disposed above the exposed at least the portion of the plurality of electrically conductive pillars. For some examples, the removing includes grinding, polishing, etching, or any other suitable removal technique to remove the at least the portion of the encapsulation material. The encapsulation material may be composed of resin or any other suitable material.

According to some examples, each of the plurality of IC dies includes a plurality of microbumps, and the one or more connectivity layers further comprise a plurality of eutectic bumps connected with vias (e.g., TSVs) disposed in the electrically insulative or semiconductive material (e.g., silicon). In this case, the testing at block 1502 may involve probing the plurality of microbumps if the testing occurs before the disposing at block 1504 or probing the plurality of eutectic bumps if the testing at block 1502 occurs after the disposing at block 1504.

According to some examples, a first row of the plurality of IC dies disposed on the wafer is composed of a first type of IC die. For some examples, a second row of the plurality of IC dies disposed on the wafer comprises a second type of IC die, different from the first type of IC die.

According to some examples, the packaging at block 1508 includes disposing a different package substrate adjacent each set in the at least the portion of the sets of IC dies; and encapsulating each set in the at least the portion of the sets of IC dies and at least a portion of the package substrate associated therewith to form the plurality of IC packages.

According to some examples, the packaging at block 1508 entails inverting the at least the portion of the sets of IC dies such that the one or more IC dies in each set are disposed above the one or more connectivity layers. In this case, the system may dispose each inverted set of one or more IC dies above a different package substrate. For some examples, the system may encapsulate each inverted set of one or more IC dies and at least a portion of the package substrate associated therewith to form the plurality of IC packages.

According to some examples, the disposing at block 1504 involves: (1) disposing a first one of the connectivity layers comprising a first portion of the one or more electrical conductors above the plurality of IC dies; and (2) disposing a second one of the connectivity layers above the first one of the connectivity layers, the second one of the connectivity layers comprising a second portion of the one or more electrical conductors.

According to some examples, the plurality of IC dies is composed of programmable IC dies (e.g., FPGA dies or CPLD dies).

According to some examples, each of the one or more groups consists of two IC dies. For other examples, each of the one or more groups may consist of more than two IC dies (e.g., three or four IC dies).

According to some examples, all the groups of the IC dies have the same number of IC dies. Such a grouping may be independent of the testing at block 1502 and may occur regardless whether the testing at block 1502 occurs before or after the disposing at block 1504. For other examples, a first portion of the groups of the IC dies has a different number of IC dies than a second portion of the groups of the IC dies. In other words, at least some of the groups of the IC dies include different numbers of IC dies than other groups of the IC dies. Such a grouping may be dependent on the testing at block 1502 and may occur when the testing at block 1502 occurs before the disposing at block 1504.

According to some examples, the dicing at block 1506 is based on the testing at block 1502. In this case, at least some of the sets of IC dies may include different numbers of IC dies.

Another example of the present disclosure is an assembly. The assembly generally includes a wafer, a plurality of IC dies disposed on the wafer, and one or more connectivity layers disposed above the plurality of IC dies, the one or more connectivity layers comprising one or more electrical conductors disposed in an electrically insulative or semiconductive material. The electrical conductors are configured to connect together two or more of the plurality of IC dies in each of one or more groups of the IC dies, and the assembly is configured to be diced into sets based at least in part on the one or more groups having IC dies that passed one or more tests, each set comprising one or more of the plurality of IC dies.

According to some examples, the one or more electrical conductors connect together the plurality of IC dies according to a predetermined pattern.

According to some examples, the one or more electrical conductors connect each of the plurality of IC dies to at least another one of the plurality of IC dies.

According to some examples, the assembly is configured to be diced by cutting through the electrical conductors between IC dies in different sets.

According to some examples, the one or more connectivity layers are disposed above the plurality of IC dies according to results of the one or more tests.

According to some examples, another wafer (or a package substrate) comprising the one or more connectivity layers, is bonded to the plurality of IC dies disposed on the wafer, such that the one or more electrical conductors connect together the two or more of the plurality of IC dies in each of the one or more groups of the IC dies.

According to some examples, each of the plurality of IC dies comprises a plurality of microbumps. In this case, each of one or more connector dies having the one or more connectivity layers may be bonded to the plurality of microbumps of two adjacent IC dies in one of the groups of the IC dies.

According to some examples, a first row of the plurality of IC dies disposed on the wafer comprises a first type of IC die, and a second row of the plurality of IC dies disposed on the wafer comprises a second type of IC die, different from the first type of IC die.

According to some examples, a first one of the connectivity layers comprising a first portion of the one or more electrical conductors is disposed above the plurality of IC dies. For some examples, a second one of the connectivity layers is disposed above the first one of the connectivity layers, the second one of the connectivity layers comprising a second portion of the one or more electrical conductors.

According to some examples, the plurality of IC dies is composed of programmable IC dies (e.g., FPGA dies or CPLD dies).

According to some examples, a first portion of the groups of the IC dies has a different number of IC dies than a second portion of the groups of the IC dies.

According to some examples, the assembly is configured to be diced based on results of the one or more tests, such that at least some of the sets of IC dies include different numbers of IC dies.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A method of fabricating a plurality of integrated circuit (IC) packages, comprising:
   testing a plurality of IC dies disposed on a wafer;
   disposing one or more connectivity layers above the plurality of IC dies, the one or more connectivity layers comprising one or more electrical conductors disposed in an electrically insulative or semiconductive material, wherein the electrical conductors are configured to connect together two or more of the plurality of IC dies in each of one or more groups of the IC dies;
   dicing the wafer having the one or more connectivity layers disposed above the plurality of IC dies into sets, each set comprising one or more of the plurality of IC dies, wherein the dicing is based at least in part on the one or more groups having IC dies that passed the testing and wherein dicing the wafer comprises cutting through the electrical conductors between IC dies in different sets; and
   packaging at least a portion of the sets of IC dies.

2. The method of claim 1, wherein the disposing comprises disposing the one or more connectivity layers such that the one or more electrical conductors connect together the plurality of IC dies according to a predetermined pattern.

3. The method of claim 1, wherein the disposing comprises disposing the one or more connectivity layers such that the one or more electrical conductors connect each of the plurality of IC dies to at least another one of the plurality of IC dies.

4. The method of claim 1, wherein disposing the one or more connectivity layers above the plurality of IC dies is not based on the testing and occurs before the testing.

5. The method of claim 1, wherein the disposing comprises:
fabricating another wafer or a package substrate, having the one or more connectivity layers comprising the one or more electrical conductors disposed in the electrically insulative or semiconductive material; and
bonding the other wafer or the package substrate to the plurality of IC dies disposed on the wafer, such that the one or more electrical conductors connect together the two or more of the plurality of IC dies in each of the one or more groups of the IC dies.

6. The method of claim 1, wherein:
each of the plurality of IC dies comprises a plurality of microbumps;
the one or more connectivity layers further comprise a plurality of eutectic bumps connected with vias disposed in the electrically insulative or semiconductive material;
the testing comprises probing the plurality of microbumps if the testing occurs before the disposing; and
the testing comprises probing the plurality of eutectic bumps if the testing occurs after the disposing.

7. The method of claim 1, wherein a first row of the plurality of IC dies disposed on the wafer comprises a first type of IC die and wherein a second row of the plurality of IC dies disposed on the wafer comprises a second type of IC die, different from the first type of IC die.

8. The method of claim 1, wherein the packaging comprises:
disposing a different package substrate adjacent each set in the at least the portion of the sets of IC dies; and
encapsulating each set in the at least the portion of the sets of IC dies and at least a portion of the package substrate associated therewith to form the plurality of IC packages.

9. The method of claim 1, wherein the disposing comprises:
disposing a first one of the connectivity layers comprising a first portion of the one or more electrical conductors above the plurality of IC dies; and
disposing a second one of the connectivity layers above the first one of the connectivity layers, the second one of the connectivity layers comprising a second portion of the one or more electrical conductors.

10. The method of claim 1, wherein a first portion of the groups of the IC dies has a different number of IC dies than a second portion of the groups of the IC dies.

11. The method of claim 1, wherein the dicing is based on the testing, such that at least some of the sets of IC dies include different numbers of IC dies.

12. The method of claim 1, wherein:
each of the plurality of IC dies comprises a plurality of microbumps; and
the disposing comprises:
fabricating one or more connector dies having the one or more connectivity layers comprising the one or more electrical conductors disposed in the electrically insulative or semiconductive material; and
bonding each of the connector dies to the plurality of microbumps of two adjacent IC dies in one of the groups of the IC dies.

13. A method of fabricating a plurality of integrated circuit (IC) packages, comprising:
testing a plurality of IC dies disposed on a wafer;
disposing one or more connectivity layers above the plurality of IC dies, the one or more connectivity layers comprising one or more electrical conductors disposed in an electrically insulative or semiconductive material, wherein the electrical conductors are configured to connect together two or more of the plurality of IC dies in each of one or more groups of the IC dies, wherein disposing the one or more connectivity layers above the plurality of IC dies is based on the testing and occurs after the testing, and wherein the disposing comprises connecting with the one or more electrical conductors only the two or more of the plurality of IC dies in each of the one or more groups having IC dies that passed the testing;
dicing the wafer having the one or more connectivity layers disposed above the plurality of IC dies into sets, each set comprising one or more of the plurality of IC dies, wherein the dicing is based at least in part on the one or more groups having IC dies that passed the testing; and
packaging at least a portion of the sets of IC dies.

14. The method of claim 13, wherein the disposing comprises:
fabricating another wafer or a package substrate, having the one or more connectivity layers comprising the one or more electrical conductors disposed in the electrically insulative or semiconductive material; and
bonding the other wafer or the package substrate to the plurality of IC dies disposed on the wafer, such that the one or more electrical conductors connect together the two or more of the plurality of IC dies in each of the one or more groups of the IC dies.

15. The method of claim 13, wherein:
each of the plurality of IC dies comprises a plurality of microbumps; and
the disposing comprises:
fabricating one or more connector dies having the one or more connectivity layers comprising the one or more electrical conductors disposed in the electrically insulative or semiconductive material; and
bonding each of the connector dies to the plurality of microbumps of two adjacent IC dies in one of the groups of the IC dies.

16. The method of claim 13, wherein a first row of the plurality of IC dies disposed on the wafer comprises a first type of IC die and wherein a second row of the plurality of IC dies disposed on the wafer comprises a second type of IC die, different from the first type of IC die.

17. A method of fabricating a plurality of integrated circuit (IC) packages, comprising:
testing a plurality of IC dies disposed on a wafer;
disposing one or more connectivity layers above the plurality of IC dies, the one or more connectivity layers comprising one or more electrical conductors disposed in an electrically insulative or semiconductive material, wherein:
the electrical conductors are configured to connect together two or more of the plurality of IC dies in each of one or more groups of the IC dies;

each of the plurality of IC dies comprises a plurality of microbumps; and the disposing comprises:

fabricating one or more connector dies having the one or more connectivity layers comprising the one or more electrical conductors disposed in the electrically insulative or semiconductive material; and bonding each of the connector dies to the plurality of microbumps of two adjacent IC dies in one of the groups of the IC dies;

dicing the wafer having the one or more connectivity layers disposed above the plurality of IC dies into sets, each set comprising one or more of the plurality of IC dies, wherein the dicing is based at least in part on the one or more groups having IC dies that passed the testing; and packaging at least a portion of the sets of IC dies.

18. The method of claim 17, wherein each of the plurality of IC dies further comprises a plurality of electrically conductive pillars, the method further comprising:

encapsulating the one or more connector dies and upper surfaces of the plurality of IC dies including the plurality of electrically conductive pillars with an encapsulation material;

removing at least a portion of the encapsulation material to expose at least a portion of the plurality of electrically conductive pillars; and disposing a plurality of eutectic bumps above the exposed at least the portion of the plurality of electrically conductive pillars.

19. The method of claim 17, wherein a first row of the plurality of IC dies disposed on the wafer comprises a first type of IC die and wherein a second row of the plurality of IC dies disposed on the wafer comprises a second type of IC die, different from the first type of IC die.

* * * * *